(12) United States Patent
Wang et al.

(10) Patent No.: US 8,954,008 B2
(45) Date of Patent: Feb. 10, 2015

(54) MEDICAL DEVICE COMMUNICATION SYSTEM AND METHOD

(71) Applicant: Medtronic, Inc., Minneapolis, MN (US)

(72) Inventors: Yu Wang, Plymouth, MN (US); George C. Rosar, Minneapolis, MN (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 13/752,716

(22) Filed: Jan. 29, 2013

(65) Prior Publication Data

US 2014/0213202 A1   Jul. 31, 2014

(51) Int. Cl.
| | |
|---|---|
| *H04B 7/00* | (2006.01) |
| *H04B 1/00* | (2006.01) |
| *H04L 27/20* | (2006.01) |
| *H04L 27/18* | (2006.01) |
| *H04L 27/10* | (2006.01) |
| *H04L 27/12* | (2006.01) |
| *H04L 27/00* | (2006.01) |

(52) U.S. Cl.
CPC . *H04B 1/00* (2013.01); *H04L 27/20* (2013.01); *H04L 27/18* (2013.01); *H04L 27/10* (2013.01); *H04L 27/12* (2013.01); *H04L 27/00* (2013.01)
USPC ............ 455/41.2; 455/41.1; 455/42; 455/119

(58) Field of Classification Search
CPC ......... H04L 27/00; H04L 27/10; H04L 27/12; H04L 27/18
USPC .................. 455/41.1, 41.2, 42, 76, 118, 119; 332/117–120, 126, 138, 139, 141
See application file for complete search history.

(56) References Cited

U.S. PATENT DOCUMENTS

| | | | | |
|---|---|---|---|---|
| 3,668,673 | A | * | 6/1972 | Adler ...................... 340/870.18 |
| 4,606,049 | A | * | 8/1986 | Daniel ......................... 375/272 |
| 4,725,827 | A | | 2/1988 | Gallegos, Jr. |
| 5,555,276 | A | | 9/1996 | Koenck et al. |
| 5,751,820 | A | * | 5/1998 | Taenzer ....................... 381/312 |
| 5,793,261 | A | * | 8/1998 | Boling, III .................. 332/102 |
| 5,983,084 | A | * | 11/1999 | Lin ........................... 455/114.2 |
| 5,999,857 | A | | 12/1999 | Weijand |
| 6,058,294 | A | * | 5/2000 | Bruwer et al. ................ 455/119 |
| 6,300,871 | B1 | * | 10/2001 | Irwin et al. ............... 340/539.28 |
| 6,490,487 | B1 | | 12/2002 | Kraus |
| 6,535,545 | B1 | * | 3/2003 | Ben-Bassat et al. .......... 375/142 |
| 6,539,253 | B2 | | 3/2003 | Thompson |
| 6,674,332 | B1 | * | 1/2004 | Wunner et al. .................. 331/18 |
| 7,065,331 | B2 | * | 6/2006 | Korden et al. ............. 455/150.1 |
| 7,069,086 | B2 | | 6/2006 | Von Arx |
| 7,719,374 | B2 | * | 5/2010 | Kuosmanen .................. 331/175 |
| 7,812,680 | B1 | * | 10/2010 | Brown et al. ................. 331/154 |
| 8,058,933 | B2 | * | 11/2011 | Frank et al. ..................... 331/46 |

(Continued)

FOREIGN PATENT DOCUMENTS

| | | |
|---|---|---|
| EP | 1360757 A1 | 11/2003 |
| EP | 1673860 A1 | 6/2006 |

(Continued)

*Primary Examiner* — Duc M Nguyen
(74) *Attorney, Agent, or Firm* — Michael J. Ostrom

(57) ABSTRACT

A medical device communication system transmitter may include a resonator coupled to a local oscillator for stabilizing an operating frequency of the local oscillator. A control device of the transmitter receives an open-loop control signal, and the local oscillator and the control device are configured to generate a direct modulated radio frequency transmission signal in response to the open-loop control signal.

20 Claims, 5 Drawing Sheets

(56) References Cited

U.S. PATENT DOCUMENTS

| | | | |
|---|---|---|---|
| 2001/0020875 A1* | 9/2001 | Jansson | 331/44 |
| 2002/0045920 A1 | 4/2002 | Thompson | |
| 2005/0088294 A1* | 4/2005 | Ibuka et al. | 340/445 |
| 2006/0203889 A1* | 9/2006 | Page | 375/130 |
| 2006/0256910 A1* | 11/2006 | Tal et al. | 375/376 |
| 2008/0068236 A1* | 3/2008 | Sheba et al. | 341/118 |
| 2008/0309424 A1* | 12/2008 | Shen et al. | 331/158 |
| 2009/0295491 A1* | 12/2009 | Tsai et al. | 331/51 |
| 2010/0249882 A1 | 9/2010 | Houben | |
| 2011/0054571 A1 | 3/2011 | Corndorf | |
| 2011/0213225 A1* | 9/2011 | Bernstein et al. | 600/309 |

FOREIGN PATENT DOCUMENTS

| | | |
|---|---|---|
| WO | 9619888 A1 | 6/1996 |
| WO | 2007062013 A3 | 5/2007 |

\* cited by examiner

MEDICAL DEVICE COMMUNICATION SYSTEM AND METHOD

FIELD OF THE DISCLOSURE

The disclosure relates generally to wireless communication systems, and in particular, to a wireless communication system for use in a medical device system.

BACKGROUND

Medical device systems may use wireless communication for transmitting data from one device to another. For example, an implantable or external monitoring or therapy delivery device may receive programming commands or operational parameters from a programmer. The monitoring or therapy delivery device may transmit data to the programmer or a computer to enable a clinical or technical expert to review data acquired by the device.

As implantable medical devices become smaller in size, the reduction in power requirements and space required for telemetry circuitry is also desired. External devices, for example wearable devices, may not have the same size limitations as implantable devices, but power conservation may still be a goal to allow a patient to be ambulatory without frequent battery changes or charges. Accordingly, a need remains for communication systems for use with medical device systems that reduce the power requirements for communication between a patient monitoring or therapy delivery device and a programmer or other communication device.

SUMMARY

A communication system for telemetric communication between medical devices includes a transmitter having a local oscillator stabilized by a resonator, such as a surface acoustic wave (SAW) resonator. A data source generates transmission data that is converted to a control signal. The control signal is received by a control device in an open loop, which controls direct modulation of the local oscillator operating frequency. In various embodiments, the control device includes a digitally controlled device, e.g. a digitally controlled oscillator providing an intermediate frequency (IF). A mixer receives the IF signal and the local oscillator signal and generates a direct modulated radio frequency (RF) transmission signal. In other embodiments, the control device includes a digitally controlled capacitor array included in an LC tank circuit coupled to the local oscillator for controlling the oscillation frequency of the local oscillator for open loop, direct modulation of the local oscillator signal to produce a RF transmission signal. Open-loop modulation of the resonator-stabilized local oscillator is made possible in either frequency shift keyed (FSK) or phase shift keyed (PSK) modulation. These and other embodiments of a medical device communication system are described herein.

This summary is intended to provide an overview of the subject matter described in this disclosure. It is not intended to provide an exclusive or exhaustive explanation of the techniques as described in detail within the accompanying drawings and description below. Further details of one or more examples are set forth in the accompanying drawings and the description below. Other features, objects, and advantages will be apparent from the description and drawings, and from the statements provided below.

DETAILED DESCRIPTION

In the following description, references are made to illustrative embodiments. It is understood that other embodiments may be utilized without departing from the scope of the disclosure.

Figure 1:
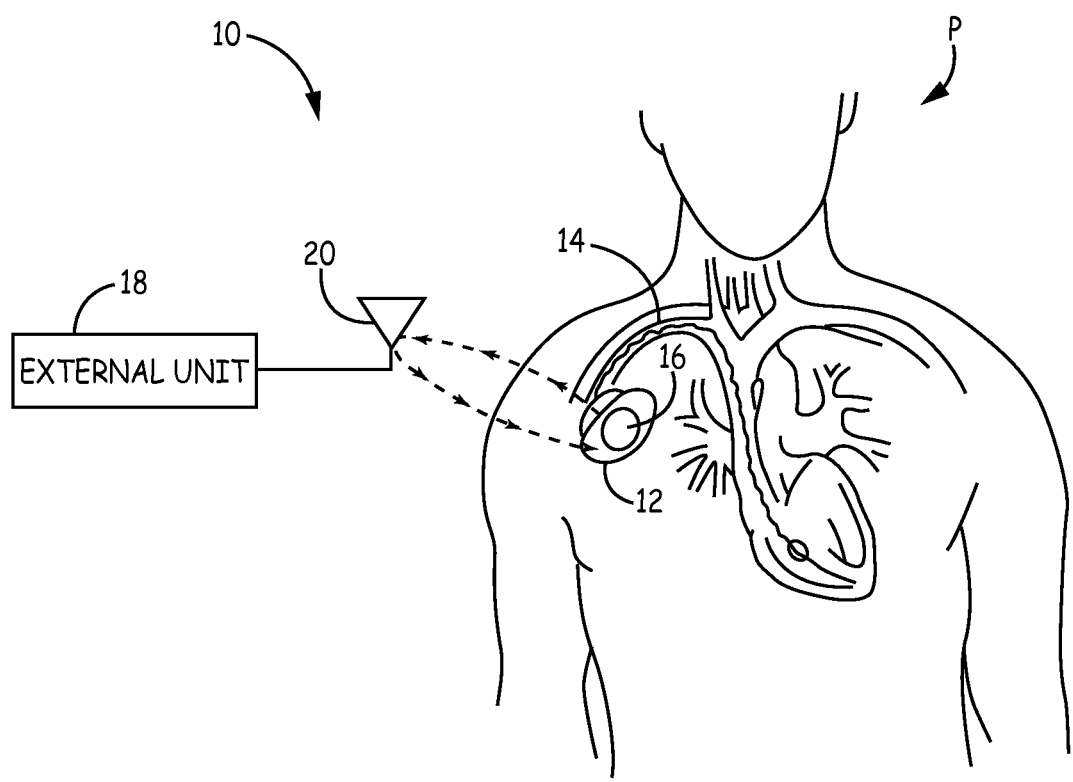
FIG. 1 is a schematic diagram illustrating a communication system according to one embodiment.

FIG. 1 is a schematic diagram illustrating a communication system 10 that enables communication between an implantable medical device (IMD) 12 and external unit 18. In one embodiment, IMD 12 is an implantable cardiac electrical stimulation device such as a cardiac pacemaker or implantable cardioverter defibrillator (ICD), but the disclosed communication system is equally applicable to many types of implantable medical devices, including implantable monitors, drug delivery devices, neurostimulation devices and more, and may even be applicable to external medical devices, such as wearable devices. IMD 12 is capable of providing cardiac electrical stimulation therapies and/or sensing physiological events of the heart of patient P via cardiac lead(s) 14. Antenna 16 is used to communicate with external unit 18. Antenna 16 may be configured as any device capable of sending or receiving electromagnetic energy. In one example, antenna 16 may be an inductive coil antenna within an IMD housing. In another example, antenna 16 may be an RF antenna located within lead connector block and coupled to communication circuitry via a feedthrough. In a further example, IMD 26 may include more than one antenna, such as both an inductive coil antenna and an RF antenna. Antenna 16 may be incorporated in or along an IMD housing or lead connector block in various embodiments.

External unit 18 is a device, such as a medical device programmer or home monitoring device, capable of communication with IMD 12 via external antenna 20. External unit 18 includes antenna 20, which may be any type of RF antenna capable of communicating in the desired RF frequencies with IMD 12, and may be located inside or outside of a housing of external unit 18. External unit 18 may be embodied as a programmer used in a clinic or hospital, for example, for programming operational parameters and or operating programs in IMD 12 for controlling IMD function and for interrogating IMD 12 for retrieving data accumulated by IMD 12. For example, upon an interrogation command transmitted from external unit 18 to IMD 12, operational device-related data, therapy delivery data, and/or physiological signal data stored by IMD 12 may be transmitted from IMD 12 to external unit 18. In alternative embodiments, external unit 18 may be a handheld device, a home monitor, a computer or any other device enabled for wireless telemetric communication with IMD 10 and used by a patient, clinician or other caregiver.

The example communication system describes a communication system 10 in which an IMD 12 communicates with an external unit 18. However, the techniques may also be utilized for a communication system having two or more implantable and/or body worn medical devices in addition to or instead of external unit 18.

Figure 2:
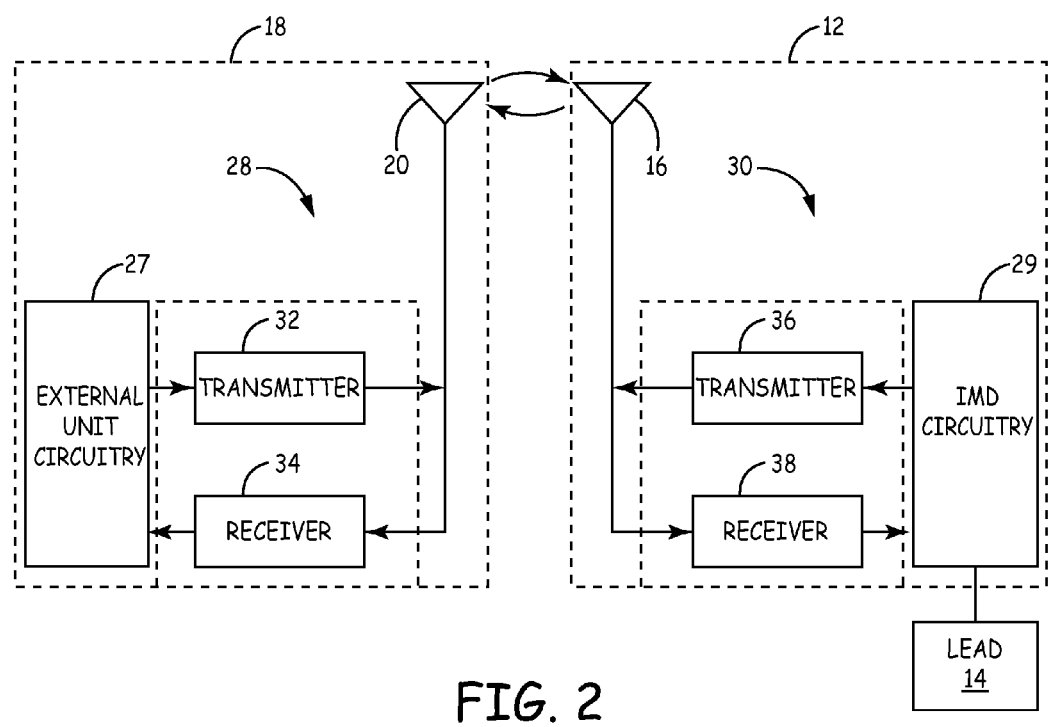
FIG. 2 is a block diagram illustrating some of the components of an implantable medical device (IMD) and an external unit that make up the communication system shown in FIG. 1.

FIG. 2 is a block diagram illustrating some of the components of IMD 12 and external unit 18 that make up communication system 10. External unit 18 includes antenna 20, external unit circuitry 27, and transceiver 28. Antenna 20 is coupled to transceiver 28 of external unit 18. External unit circuitry 27 includes a microprocessor and software to control the operation of external unit 18. Transceiver 28 enables external unit circuitry 27 to transmit and receive communications with IMD 12. Transceiver 28 of external unit 18 includes transmitter 32 and receiver 34.

IMD 12 includes antenna 16, IMD circuitry 29, and transceiver 30. Antenna 16 is coupled to transceiver 30 of IMD 12. IMD circuitry 29 includes a microprocessor and software for controlling the operation of IMD 12 and for processing data, therapy delivery circuitry for delivering a therapy through lead 14, and sensors for generating data, including data generated by detecting electrical signals on lead 14. IMD 12 may include other sensors and/or therapy delivery devices according to a particular medical application. Transceiver 30, coupled to antenna 16, enables IMD circuitry 29 to transmit and receive communications with external unit 18. Transceiver 30 includes transmitter 36 and receiver 38, which transmit and receive data using RF electromagnetic waves.

Communication between IMD 12 and external unit 18 can be performed over any communication band. In one embodiment, the communication occurs over a public radio frequency band. In another embodiment, the communication occurs over the Medical Implant Communication (MICs) band between 402 MHz and 405 MHz. Although the techniques disclosed herein are described with reference to illustrative radio frequency bands, it is recognized that the disclosed techniques may be implemented in conjunction with any communication bands and may be useful with other types of electromagnetic communication.

Because IMD 12 has a finite battery capacity, one consideration in the design of RF communication system 10 is the energy efficiency of IMD 12. Thus, an improvement in energy efficiency of transceiver 30 will lead to increased battery life of IMD 12. Energy efficiency is less of an issue in the design of external unit 18, because external unit 18 may not be restricted to the same size limitations and can therefore dedicate a larger volume for battery(ies) or could be connected to an external power source such as a 120V AC outlet. Therefore, reducing the energy consumption of transceiver 30 is particularly beneficial. It is contemplated, however, that a power efficient transceiver and associated techniques as described herein may be implemented in one or both medical devices being used in a two-way communication system 10, such as both of devices 12 and 18.

Transmitter 32 may transmit a wake-up signal prior to the transmission of data. Receiver 38 periodically powers up to enable receiver communication channels to listen for this wake-up signal, rather than remaining on at all times, while still ensuring that receiver 38 will not miss the transmission of any data. The wake-up signal contains a modulation pattern recognizable by receiver 38. If receiver 38 detects signals on a communication band, but finds that the signals do not contain the modulation pattern, receiver 38 can shut down since the detected signal is not a communication initiated by transmitter 32 for receiver 38. Furthermore, the wake-up signal may contain embedded data that allows the receiver 38 to identify an intended communication channel for subsequent transmission of data. Receiver 38 may continue operating in a low power receiver mode while receiving the embedded data, and then adjust its receiver configuration settings as specified by the embedded data to initiate the higher power receiver mode for receipt and analysis of the transmitted data.

The components of IMD 12 and external device 18 may include any one or more processors, controllers, digital signal processors (DSPs), application specific integrated circuits (ASICs), field-programmable gate arrays (FPGAs), or equivalent discrete or integrated circuitry, including analog circuitry, digital circuitry, or logic circuitry. In addition, IMD 12 and external device 18 may include non-transitory computer readable storage media that include computer-readable instructions that, when executed by one of the components of IMD 12 or external device 18, cause IMD 12 or external device 18 to perform various functions attributed to those components in this disclosure. The computer-readable storage medium may include any volatile, non-volatile, magnetic, optical, or electrical media, such as a random access memory (RAM), read-only memory (ROM), non-volatile RAM (NVRAM), static non-volatile RAM (SRAM), electrically-erasable programmable ROM (EEPROM), flash memory, or any other non-transitory computer-readable storage media.

Figure 3:
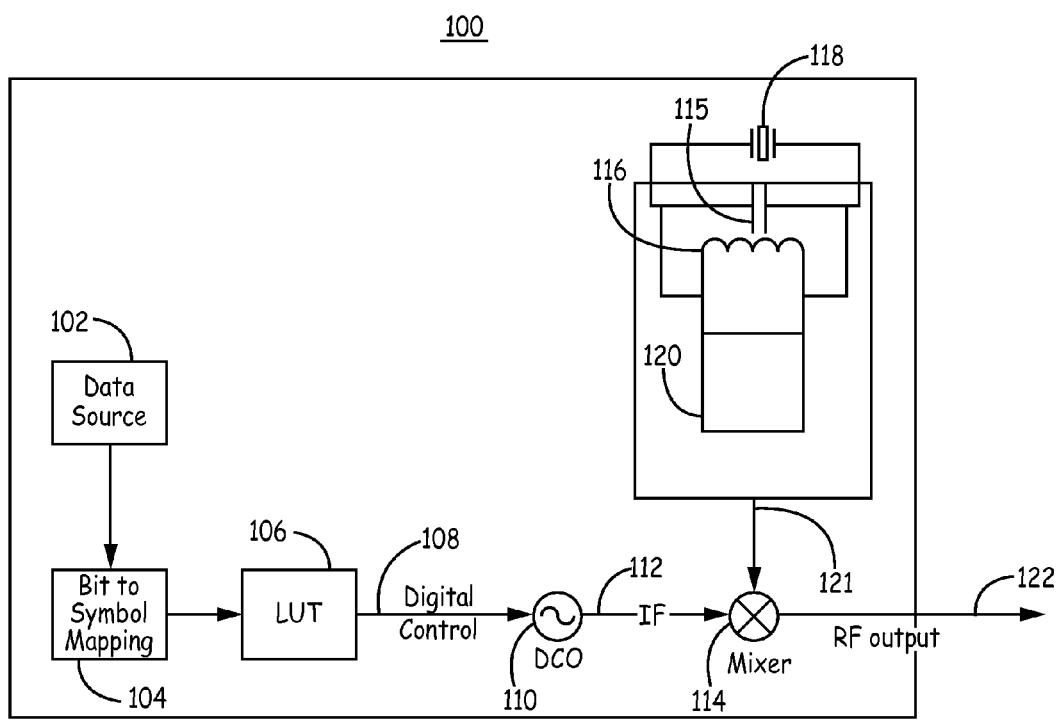
FIG. 3 is a block diagram of a power efficient medical device transmitter according to one embodiment.

FIG. 3 is a block diagram of a power efficient medical device transmitter 100 that may correspond to transmitter 36 (and optionally transmitter 32) shown in FIG. 2 in one embodiment. In an illustrative embodiment, transmitter 100 includes an open loop modulator for generating radio frequency (RF) transmission signals. The transmitter 100 includes a local oscillator 120 stabilized by a surface acoustic wave (SAW) resonator 118. The SAW resonator 118 may be an off-chip resonator applied at the base (for bipolar junction transistors) or gate (for CMOS integrated circuits) of the oscillator 120. Oscillator 120 may be coupled to an LC tank circuit for controlling the operating frequency of the local oscillator 120. The LC tank circuit includes inductor 116 and capacitor 115. In the example illustrated in FIG. 3, the inductor 116 and capacitor 115 of LC tank circuit are connected in parallel. In other instance, the inductor 116 and capacitor 115 of LC tank circuit may be connected in series. The LC tank circuit may, in some instances, include a varactor diode as a part of the LC tank capacitance represented by capacitor 115 to provide voltage controlled resonant frequency of the local oscillator 120. In some embodiments, the oscillator 120 is a cross-coupled negative resistance oscillator but may be implemented as other types of oscillators, including integrated circuit oscillators.

Transmitter 100 includes a data source module 102 which provides baseband signal and digitized data to be transmitted. Data source module 102 may receive data to be transmitted from the IMD circuitry 29, which may include physiological signal data, therapy related data, programmed operating parameters, device diagnostic data or any other data accumulated by the IMD 12.

Data source module 102 provides data to be transmitted to mapping module 104. The data provided to mapping module 104 may be at baseband and/or encrypted in some instances. Mapping module 104 in combination with look up table (LUT) 106 converts the data to be transmitted, which is in the form of one or more bits of information, received from data source 102 to a digital control signal 108. In this manner, mapping module 104 and LUT 106 may be viewed as a signal source for generating a control signal. In alternative embodiments, a central processing unit or microprocessor may be used as the signal source for generating the control signal in place of a LUT for converting the bit information to a digital control signal, however using a LUT conserves power consumption and hardware space requirements.

The digital control signal 108 generated by mapping module 104 and LUT 106 is provided to a digitally controlled device included in transmitter 100. The digital control signal 108 defines the transmission channel, e.g. baseband signal frequency or phase, and the direct modulation to be applied to the local oscillator signal for generating a frequency modulated (FSK) or phase modulated (PSK) radio frequency transmission signal containing the transmission data. In one embodiment, the digitally controlled device receiving the digital control signal 108 is embodied as a digitally controlled oscillator (DCO) 110 as shown in FIG. 3. The digital control signal 108 controls DCO 110 to produce an output signal 112 provided to mixer 114. The LUT 106 or other means for generating a digital control word from the bit-to-symbol mapping provided by mapping module 104 is optimized based on the DCO.

Mixer 114 receives a fixed oscillation signal 121 from local oscillator 120 and the intermediate frequency signal 112 from digitally controlled oscillator 110, which defines the channelization and frequency or phase modulation to be applied to the fixed oscillation signal 121. Mixer 114 generates a radio frequency transmission output signal 122 in response to the intermediate frequency signal 112 and the local oscillation signal 121.

A single high frequency local oscillator 120 is used for generating the fixed local oscillator signal 121 which is modulated by mixer 114 with input from the DCO 110 in an open loop. The DCO 110 may operate at a relatively low frequency, e.g. 20-30 MHz, as compared to the typically much higher operating frequencies of a transmitter synthesizer. The transmitter disclosed herein does not require phase lock loop operation commonly employed in radio frequency transmitters. The local oscillator frequency is stabilized by the SAW resonator 118 such that open loop modulation of the local oscillator signal can be performed without a phase lock loop or any other feedback control loop for controlling oscillation of the single local oscillator 120 at an operating frequency. The digital control signal 108 is thus an open-loop control signal controlling modulation of the local oscillation signal at the operating frequency.

Figure 4:
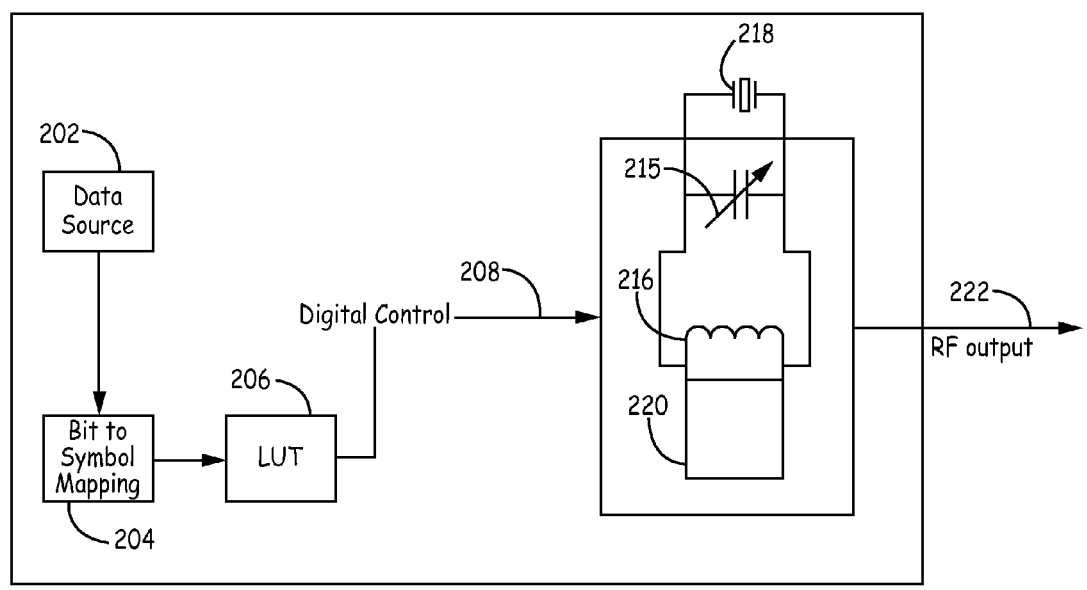
FIG. 4 is a block diagram of a medical device telemetry system transmitter according to an alternative embodiment.

FIG. 4 is a block diagram of a medical device system transmitter 200 according to an alternative embodiment. Transmitter 200 includes a data source 202, mapping module 204 and look-up table 206 as described in conjunction with FIG. 3, for performing bit-to-symbol mapping and digital control signal generation for converting bit information received from the data source 202 to a digital control signal 208. In the embodiment of FIG. 4, the digitally controlled device receiving the digital control signal 208 is a digitally controlled capacitor array 215. The operating frequency of local oscillator 220 is controlled by an LC tank represented by digitally-controlled capacitor array 215 and inductor 216. Local oscillator 220 may be embodied as a cross coupled negative resistance oscillator as described above or other integrated circuit oscillator. The frequency of oscillator 220, as controlled by the digitally controlled capacitor array 215, is stabilized by the SAW resonator 218.

The digitally-controlled capacitor array 215 responds to the digital control signal 208 to provide channelization and direct modulation of the resonant oscillation frequency of the local oscillator 220. Digitally-controlled capacitor array 215 may include a plurality of capacitors. The digitally-controlled capacitor array 215 could alternatively be embodied as an analog controlled device, such as a varactor, and the LUT 206 generating a digital control signal would be replaced by analog control signal generation. A digitally controlled device may be desirable for ease of implementation in an integrated circuit, and the digital capacitor array 215 may provide even greater power efficiency of the transmitter 200 as compared to the transmitter 100 having a digitally controlled oscillator 110.

Generally, a multi-channel transmitter requires a synthesizer or is limited to only frequency modulation of the RF signal. The transmitters 100 and 200 disclosed herein are capable of multi-channel RF transmission of direct frequency modulated or phase modulated signals, without use of a synthesizer, and using only a single local oscillator. Direct phase modulation can be achieved in an open loop. The transmitters 100 and 200 of FIGS. 3 and 4 may operate to produce an RF output signal 122 and 222, respectively, in the Medical Implant Communication Service (MICS) band of communication channels, Medical Data Service (MEDS) band, or other designated communication band.

The separate embodiments of FIGS. 3 and 4 may be combined such that a digital control device included in an IMD transmitter includes both a DCO and a digital capacitor array. For example, a digital control signal may be provided to a DCO to control RF channelization by an IF signal mixed with the local oscillation signal by a mixer. A digital control signal may additionally be provided to a digital capacitor array to control RF modulation of the local oscillation signal to embed data in the channelized RF output signal in an FSK or PSK scheme. Direct digital control of the capacitor array provides for direct modulation of the local oscillation signal (without analog-to-digital conversion), and multiple RF channel operation is provided by the DCO signal and local oscillation signal mixing. The transmitter with a digital control device for direct modulation of a SAW-stabilized local oscillation may be fully implemented in an application specific integrated circuit with an off-chip SAW resonator in some embodiments.

Figure 5:
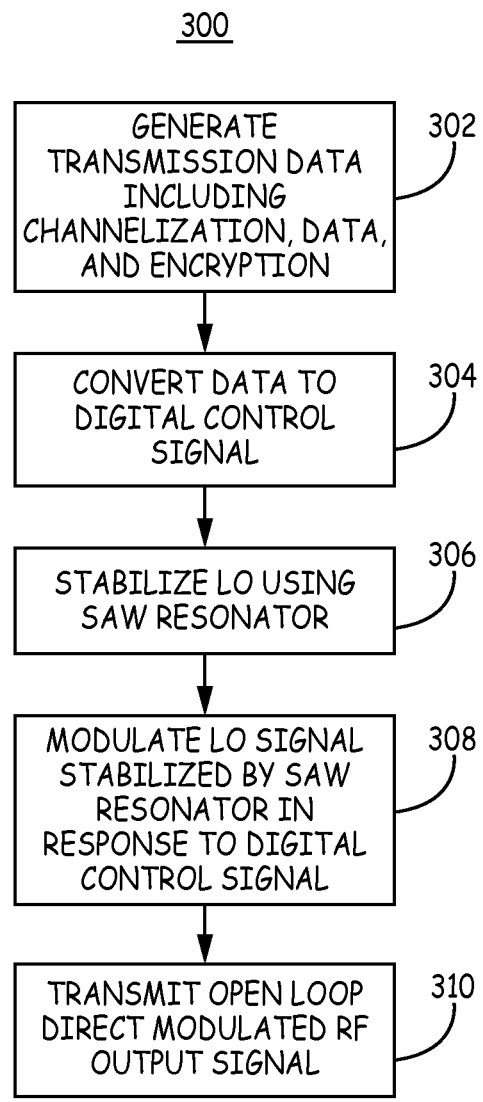
FIG. 5 is a flow chart of a method for telemetry communication for use in a medical device system.

FIG. 5 is a flow chart 300 of a method for telemetry communication for use in a medical device system. The method shown by flow chart 300 is particularly useful for telemetry communication between an implantable device and an external device or another implantable medical device wherein a power efficient transmitter as described herein is implemented at least in the implanted device. At block 302, information to be transmitted is generated by a data source. Data may be acquired by the IMD and stored in memory for later transmission or transmitted in real time. The transmission data may include channel information, physiological, therapy and/or device related data, and encryption information. The data source may include one or more processors and associated memory processing sensor signal information, device diagnostics, or controlling and generating therapy delivery data.

At block 304, a mapping module and look-up table or other processing device converts the transmission data to a digital control signal. Conversion to a digital control signal includes bit to symbol mapping and using a look up table to generate digital control words. A re-programmable mapping module converts the transmission data to a digital control signal that will drive the DCO and/or digital capacitor array of the main local oscillator. The digital control signal is based on the modulation scheme of the transmitter. In case of FSK modulation, the digital control word is directly translated from the RF channel frequency, frequency deviation and data rate. For PSK modulation, the digital control word is based on the phase advance/retard.

At block 306, a local oscillator signal is modulated to generate an RF transmission signal in response to the digital control signal. A digitally controlled device, such as a digitally controlled oscillator and/or a digitally controlled capacitor array as described above, receives the digital control signal. The digital control signal is used to generate an intermediate frequency signal by a digitally controlled oscillator that is mixed with the local oscillator signal to generate an RF transmission signal in some embodiments. In other embodiments, the digital control signal is additionally or alternatively applied to a digitally controlled capacitor array included in an LC tank controlling the frequency of the local oscillator to generate the RF transmission signal. In this way, the local oscillator signal is modulated directly in an open loop to generate a FSK or PSK channelized and modulated RF transmission signal. The open-loop, direct modulated RF output signal is transmitted to a receiver, e.g. of a programmer, at block 310.

Thus, a communication system and associated method have been presented in the foregoing description with reference to specific embodiments. It is appreciated that various modifications to the referenced embodiments may be made without departing from the scope of the disclosure as set forth in the following claims.

The techniques described in this disclosure, including those attributed to IMD 26, may be implemented, at least in part, in hardware, software, firmware or any combination thereof. For example, various aspects of the techniques may be implemented within one or more processors, including one or more microprocessors, DSPs, ASICs, FPGAs, or any other equivalent integrated or discrete logic circuitry, as well as any combinations of such components, embodied in programmers, such as physician or patient programmers, stimulators, or other devices. The term "microprocessor" may generally refer to any of the foregoing circuitry, alone or in combination with other circuitry, or any other equivalent circuitry.

Such hardware, software, or firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

When implemented in software, the functionality ascribed to the systems, devices and techniques described in this disclosure may be embodied as instructions on a non-transitory computer-readable medium such as RAM, ROM, NVRAM, EEPROM, or flash memory, magnetic data storage media, optical data storage media, or the like. The instructions may be executed to support one or more aspects of the functionality described in this disclosure.

The invention claimed is:

1. A medical device communication system having a transmitter, wherein the transmitter comprises:
 a local oscillator;
 a resonator coupled to the local oscillator for stabilizing an oscillation frequency of the local oscillator;
 a signal source providing a control signal; and
 a control device for receiving the control signal in an open loop, wherein the control device comprises a digitally controlled oscillator configured to receive the control signal;
 the local oscillator and the control device configured to generate a modulated radio frequency transmission signal in response to the open-loop control signal.

2. The communication system of claim 1, wherein the transmitter comprises a single local oscillator.

3. The communication system of claim 1, wherein the resonator is a surface acoustic wave resonator.

4. The communication system of claim 1, further comprising an LC tank circuit coupled to the local oscillator for controlling the operating frequency of the local oscillator.

5. The communication system of claim 1, further comprising a mixer coupled to the digitally controlled oscillator and the local oscillator,
 the mixer receiving a first signal from the digitally controlled oscillator and a second signal from the local oscillator and generating the radio frequency transmission signal in response to the first signal and the second signal.

6. The communication system of claim 1, further comprising a data source that provides data to be transmitted, wherein the signal source generates the control signal based on the data to be transmitted.

7. The communication system of claim 6, wherein the signal source comprises a mapping module and a look up table configured to generate the control signal defining a channelization and a modulation of the local oscillator signal.

8. The communication system of claim 1 wherein the radio frequency signal is one of a frequency modulated signal and a phase modulated signal.

9. The communication system of claim 1, wherein the control device further comprises a digital capacitor array, the digitally controlled oscillator configured to generate an intermediate frequency defining a radio frequency channelization of the transmission signal in response to the control signal and the digital capacitor array configured to modulate an operating frequency of the local oscillator in response to the digital control signal.

10. A method for wireless communication in a medical device system, comprising:
 stabilizing an operating frequency of a local oscillator included in a transmitter with a resonator coupled to the local oscillator;
 enabling a signal source to generate an open-loop control signal; and
 enabling a control device configured to receive the open-loop control signal and the local oscillator to cooperatively generate a modulated radio frequency transmission signal in response to the open-loop control signal, wherein enabling the control device comprises enabling a digitally controlled oscillator.

11. The method of claim 10, further comprising enabling a single local oscillator and the control device to cooperatively generate the radio frequency transmission signal.

12. The method of claim 10, further comprising stabilizing the local oscillator operating frequency with a surface acoustic wave resonator.

13. The method of claim 10, further comprising controlling the operating frequency of the local oscillator using an LC tank circuit.

14. The method of claim 10, further comprising enabling a mixer coupled to the digitally controlled oscillator and the local oscillator to receive a first signal from the digitally controlled oscillator and a second signal from the local oscillator and to generate the radio frequency transmission signal in response to the first signal and the second signal.

15. The method of claim 10, wherein enabling the control device comprises enabling a digitally controlled capacitor array coupled to the local oscillator.

16. The method of claim 10, further comprising providing data to be transmitted to the signal source, wherein the signal source generates the open-loop control signal based on the data to be transmitted.

17. The method of claim 10, wherein the signal source includes a mapping module and a look up table, wherein the mapping module and the look up table generate the control signal to define a channelization and a modulation of the radio frequency signal.

18. The method of claim 10, further comprising modulating one of the frequency and the phase of the local oscillator operating frequency.

19. The method of claim 10, wherein enabling the digitally controlled oscillator comprises enabling the digitally controlled oscillator to generate an intermediate frequency defining a radio frequency channelization of the transmission signal in response to the control signal and enabling a digital capacitor array to modulate an operating frequency of the local oscillator in response to the digital control signal.

20. A medical device communication system, comprising:
an implantable transmitter comprising:
a local oscillator;
a resonator coupled to the local oscillator for stabilizing an operating frequency of the local oscillator;
a data source that provides data to be transmitted;
a signal source generating an open-loop control signal, wherein the signal source generates the open-loop control signal based on the data to be transmitted, the signal source including:
a mapping module, and
a look up table configured to generate the open-loop control signal defining a channelization and a modulation of the local oscillator signal;
a control device for receiving the open-loop control signal;
the local oscillator and the control device configured to generate a modulated radio frequency transmission signal in response to the open-loop control signal; and
an external receiver configured to receive the radio frequency transmission signal.

\* \* \* \* \*